United States Patent [19]

Grib

[11] Patent Number: 4,644,188

[45] Date of Patent: Feb. 17, 1987

[54] VOLTAGE COMPARISON CIRCUITS FOR MOTION AMPLITUDE REGULATORS OR THE LIKE

[75] Inventor: Boris F. Grib, Huntington, N.Y.

[73] Assignee: Philamon, Inc., Farmingdale, N.Y.

[21] Appl. No.: 657,807

[22] Filed: Oct. 4, 1984

Related U.S. Application Data

[62] Division of Ser. No. 16,160, Mar. 1, 1979.

[51] Int. Cl.[4] ............................................ H03K 5/153
[52] U.S. Cl. .................................. 307/363; 307/354; 307/318
[58] Field of Search ................. 307/351, 354, 363, 318

[56] References Cited

U.S. PATENT DOCUMENTS 3,033,996  5/1962  Atherton ............................. 307/363
3,502,911  3/1970  Lehman ............................... 307/363
3,553,490  1/1971  Darrow ............................... 307/363

Primary Examiner—John Zazworsky
Attorney, Agent, or Firm—Robert R. Keegan

[57] ABSTRACT

There is disclosed a driving and control circuit for a tuning fork resonator also adaptable to rotary motor control wherein an approximately sine wave signal from a motion sensor is applied to an instantaneous level detector which causes a control signal to be generated during that portion of the sine wave signal where the instantaneous level exceeds an adjustable reference level; the control signal causes the application of a current to the tuning fork drive which is in a direction to cause braking and reduction of motion amplitude. A distinctive feature of the instantaneous level detector is the fact that the sine wave signal is not rectified but is rather converted to a fluctuating direct current signal with a DC level accurately determined by an internal semiconductor voltage reference element.

14 Claims, 4 Drawing Figures

VOLTAGE COMPARISON CIRCUITS FOR MOTION AMPLITUDE REGULATORS OR THE LIKE

This application is a division, of application Ser. No. 016,160, filed Mar. 1, 1979.

This invention relates to energy or power control-motion amplitude regulating driving circuits for resonant mechanisms or other apparatus. In the specific example a circuit for driving a tuning fork optical chopper or scanner is described. The principal distinctive feature of the apparatus is a provision for regulation of the amplitude (and velocity) of the resonant mechanism of the optical chopper.

The electrical apparatus of the present invention is especially well adapted to provide amplitude (or velocity) regulated drive power to a resonant mechanism having a substantial inertial property or "Q", such as a tuning fork. Quality factor "Q" is defined as two pi times the ratio of the maximum stored energy to the energy dissipated per cycle at a given frequency. With mechanical resonators having a "Q" in excess of about 100 energy input is effectively integrated regardless of waveform. The effect of a non-sinusoidal wave thus can be equated with a sine wave. A sine wave with an rms drive current approximately equal to 0.9 of the peak value of a square wave is its effective equivalent. Similarly, more complex drive waveforms can be considered equivalent to a sine wave of determinable amplitude.

The application of the circuit of the invention to drive mechanical resonators is the most common anticipated application. The circuit incorporating the invention may also be applied to controlling the drive of rotating machinery, in which case the regulated parameter would be the velocity of rotation.

In most optical modulating, chopping or scanning applications it is desirable to have reasonably constant frequency and reasonably constant motion amplitude. With a properly made self-resonant chopper or scanner, reasonably constant frequency can be achieved by simply stabilizing the stiffness and mass-determining portions of the design which determine self-resonant frequency.

Achieving constant motion amplitude however is not as simple. Basically, chopper or scanner motion amplitude is proportional to device "Q" and (in the case of electromagnetically driven design) also proportional to drive current applied. "Q" is essentially the inverse of energy losses and the losses can vary depending upon metallurgical friction of bending members, the amount of "out of balance" energy coupled to the base mount mass of the device, the effects of drive and pickup, eddy current and hysteresis losses, and, most significantly, the "windage" losses at high motion amplitudes. It is not unusual for example for the "Q" of a chopper to double and thus motion amplitude double when normal atmosphere windage losses are eliminated by placing it in a vacuum (simulating outer space satellite applications).

Drive current can unintentionally vary depending upon circuit design and component changes and DC input supply voltage changes. A reduction of DC input supply voltage of 20 percent for example (as might be caused by near exhausted batteries in a satellite application) could cause a 20 percent decrease in drive current and a consequent loss of 20 percent of desired motion amplitude.

In essence, the motion amplitude regulation objectives of the disclosed invention are accomplished by initially applying substantially more drive current than is actually needed for desired motion amplitude, and then instantaneously regulating "down" by applying during each cycle of motion a reverse "bucking" or "braking current". The braking current is preferably considerably in excess of original peak drive current and has a time duration determined by the excess of "attempted" amplitude as compared to that of desired amplitude. Regulation is done automatically as determined by a suitably amplified and phased chopper or scanner pickup voltage (directly proportional to motion amplitude) being applied to a novel peak level-detecting zener-referenced AC voltage comparator circuit. An excess of instantaneous pickup voltage over an adjustable reference level causes braking current to switch on for the period of time the sinusoidal pickup voltage waveform exceeds the reference level. Contrary to systems where amplitude is averaged over several cycles before being compared with a reference, the present invention instantaneously applies a corrective braking current when excess peak amplitude is sensed.

In addition to providing the features and advantages described above it is an object of the present invention to provide an electronic motion amplitude regulator for resonant mechanical devices such as tuning forks, optical choppers, scanners or the like in which excess motion amplitude is sensed in each cycle and a short pulse of braking current which is a function of the excess motion amplitude is applied to the drive circuit for the resonant mechanical device.

It is another object of the present invention to provide a velocity or amplitude regulator for a mechanical device in which the velocity of the device is sensed and excess velocity is caused to produce a braking current in the drive circuit for the device.

A further object of the present invention is to provide in a motion amplitude regulator a capacitively input-coupled zener-referenced peak AC voltage level detector having a symmetrical input impedance which preserves the integrity of the zener determined DC level.

Other objects and advantages of the present invention will be apparent from consideration of the following description in conjunction with the appended drawings in which.

Figure 1:
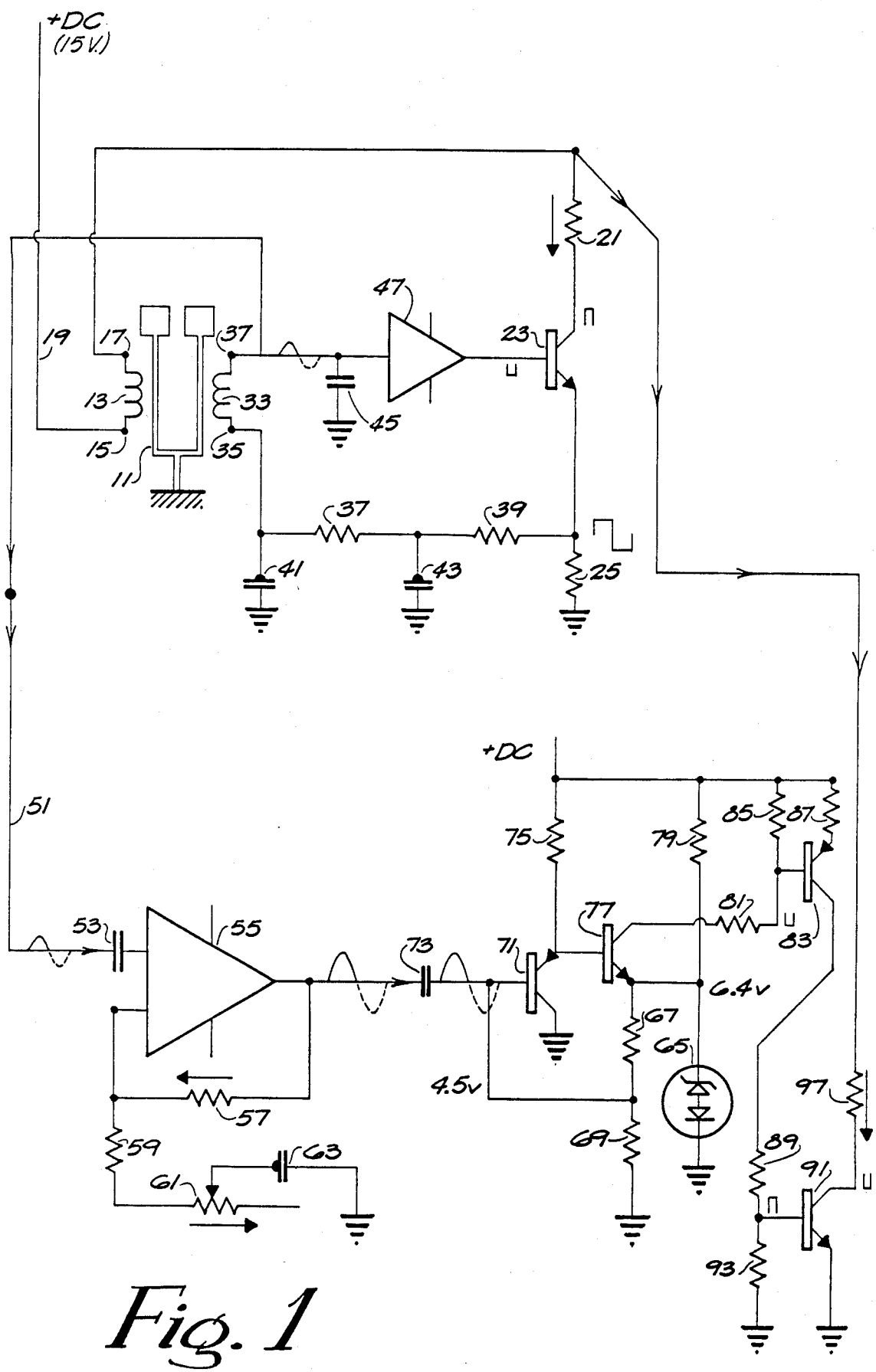
FIG. 1 is a schematic circuit diagram of motion amplitude regulator apparatus according to the invention.

Referring to FIG. 1 an optical chopper 11 is shown schematically which consists essentially of a tuning fork having a pair of vanes or shutters mounted thereon between which a light beam will be passed. The particular construction of the optical chopper 11 is not relevant to the present invention and in fact the motion amplitude regulator of the invention may be applied to control of numerous forms of resonant or non-resonant devices which are electromagnetically driven.

A drive coil 13 is provided for the tuning fork of chopper 11; coil 13 has terminals 15 and 17. Terminal 15 is connected by lead 19 to a DC power supply which may, for example, be a 15 volt regulated power supply.

Terminal 17 of drive coil 13 is connected through a resistor 21 to the collector of a transistor 23. The emitter of transistor 23 is connected through resistor 25 to ground. Thus, when transistor 23 is conducting as a result of the signal applied to its base, drive current will flow through drive coil 13, resistor 21, transistor 23 and resistor 25 to ground.

The drive circuit for the chopper is a conventional self-biasing circuit. A pickup coil 33 having terminals 35 and 37 provides the pickup signal for the regenerative oscillator circuit. Terminal 35 of pickup coil 33 is connected through a filter circuit consisting of resistors 37, 39 and capacitors 41, 43, to the positive end of resistor 25. Upon initial application of plus DC voltage resistor 25 biases the collector of transistor 23 midway between on and off thus permitting initial maximum loop gain for starting oscillation.

The voltage of pickup coil 33 appears at the ungrounded terminal of capacitor 45 and is amplified in the proper phase relation in conventional operational amplifier 47. Amplifier 47 may have a gain of approximately 40 which is more than sufficient to apply an amplified inverted pickup signal to the base of transistor 23 causing transistor 23 to supply a substantially square wave pulse drive current of proper phase to drive coil 13.

The apparatus thus far described is a generally conventional drive circuit for a tuning fork oscillator or optical scanner. As previously explained generally the conventional drive circuit may produce a constant frequency oscillation due to the inherent frequency stability of the tuning fork or optical scanner but amplitude of the resonant mechanical device is not controlled or regulated by the conventional drive circuit.

In order to regulate the amplitude of the resonant mechanical device the circuit of FIG. 1 takes an output signal from pickup coil 33 over lead 51 through capacitor 53 to amplifier 55. Amplifier 55 is a conventional operational amplifier with a feedback resistor 57 connected from its output to its input. The feedback input of amplifier 55 is connected through resistor 59, variable resistor 61 and capacitor 63 to ground. Adjustment of resistor 61 to increase its resistance decreases the gain of amplifier 55 and as will later be seen produces an increase in the regulated motion amplitude. Amplifier 55 may have a nominal gain of about 23.

As previously explained it is the purpose of the motion amplitude regulation circuit to detect motion amplitude in excess of the desired motion amplitude and apply a braking current to drive coil 13 for optical chopper 11. The output of amplifier 55 is a linear function of the pickup coil voltage which is essentially proportional to the tine velocity of the optical chopper 11. Since peak motion amplitude of the optical chopper 11 is proportional to the peak tine velocity the output of amplifier 55 has a peak which is essentially a linear function of the optical chopper motion amplitude. Since the output of amplifier 55 is actually responsive to velocity rather than amplitude it is 90 degrees out of phase with the instantaneous amplitude of the optical chopper tine motion; this, however, is not material to the operation of the circuit because the important phase relationship is that between the output signal of pickup coil 33 (and of amplifier 55) relative to the drive current supplied to drive coil 13.

From the previous discussion it will be seen that it is desired to compare the positive going instantaneous level of the output of amplifier 55 with a reference voltage. The reference voltage is supplied by a zener diode 65 which may have a reference voltage of 6.4 volts for example. Resistors 67 and 69 form a voltage divider which produces a fraction of the reference voltage of zener diode 65 (for example 4.5 volts) at the base of a transistor 71 to which is also connected the output of amplifier 55 through a capacitor 73. Transistor 71 is a PNP transistor with its collector grounded and its emitter connected through resistor 75 to the positive DC power supply.

The emitter of transistor 71 is connected to the base of an NPN transistor 77 having its emitter connected to the positive terminal of zener diode 65. The positive terminal of zener diode 65 is connected through a resistor 79 to the positive power supply. The collector of transistor 77 is connected through a resistor 81 to the base of a transistor 83 which is also connected through a resistor 85 to the positive power supply. Transistor 83 is a PNP transistor. The emitter of transistor 83 is connected through a resistor 87 to the positive power supply while its collector is connected through a resistor 89 to the base of a switching transistor 91.

The base of transistor 91 is connected through a resistor 93 to ground; the emitter of transistor 91 is connected to ground. The collector of transistor 91 is connected through a resistor 97 to the terminal 17 of drive coil 13 to provide an alternate current path for drive current through coil 13, resistor 97, and transistor 91 to ground.

The zener diode 65 in conjunction with voltage dividing resistors 67 and 69 set a DC level for the output of amplifier 55 at 4.5 volts at the base of transistor 71. At the same time a level of 6.4 volts is set for the emitter of transistor 77 which is paired with transistor 71. Therefore, when the AC output of amplifier 55 coupled through capacitor 73 slightly exceeds a positive instantaneous value of 1.9 volts (6.4 volts minus 4.5 volts), transistor 71 starts to turn off turning on transistor 77 and in turn transistor 83 and finally switching transistor 91 causing "reverse" braking current to flow through drive coil 13. While the level detecting circuit may be considered to be a peak detector, it might be more accurately designated an instantaneous level detector because it deactivates on the down-going side of the peak.

It is important to note that there is no DC level shift due to the change in the level of the output of amplifier 55 nor is there any DC level shift from changes in power supply voltage. Thus, the peak (positive) value of the AC output from amplifier 55 (which is a predetermined multiple of the pickup coil output) is accurately determined. The positive peak of slightly more than 1.9 volts corresponds to about 1.4 volts rms. With a gain for amplifier 55 of about 23, the regulated level of output of pickup coil 33 is about 61 millivolts rms.

The remarkable efficacy of the AC instantaneous level comparator circuit of the invention can only be appreciated in terms of the problems existing with previous circuits. The basic objective of the circuit is to measure the AC peak level and consequently one utilizes capacitive coupling as represented by capacitor 73 to eliminate any effect from the level of the DC component at the output of amplifier 55. That technique is also used in prior circuits.

However, prior circuits commonly have next rectified the AC signal coupled through the coupling capacitor. As a result the input impedance viewed looking forward from the coupling capacitor is dependent upon the instantaneous voltage level. There is a certain threshhold below which current is not drawn by the input to the next stage whereas above that level significant current is drawn. Such an asymmetrical current drain charges the coupling capacitor at the input and produces an error because DC level is thereby affected by the magnitude of the AC signal. It has been suggested that this problem can be remedied by inserting a buffer stage in the circuit but such remedy may itself create other problems.

In the circuit of the invention a different approach is used which essentially avoids rectification of the AC signal by causing the mid-value of the AC voltage waveform to be raised to a specific, accurately regulated value.

As seen in FIG. 1 the zener diode designated 65 produces an accurately controlled voltage (in this case 6.4 volts) at the emitter of transistor 77. The resistors 67 and 69 form a voltage divider between the emitter and ground, the center tap of which is connected to the input at the base of transistor 71. The voltage divider center tap voltage thus determined (in this case 4.5 volts) causes the DC level seen by transistor 71 to be accurately set at a fixed value which does not vary with the AC level.

Figure 2A:
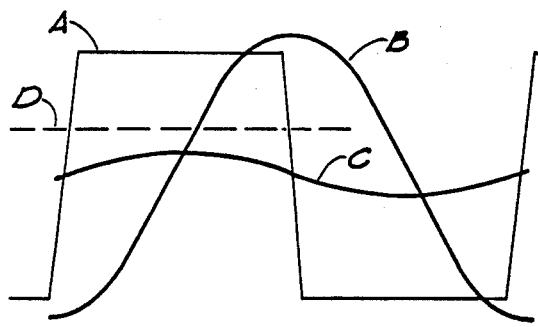
FIGS. 2A, 2B and 2C are waveform diagrams of motion amplitude, drive current, and pickup voltage useful in explaining the operation of the apparatus of FIG. 1.
Figure 2B:
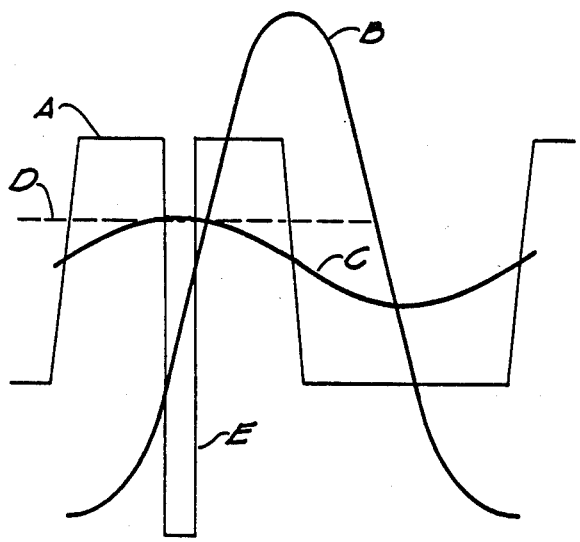
Figure 2C:
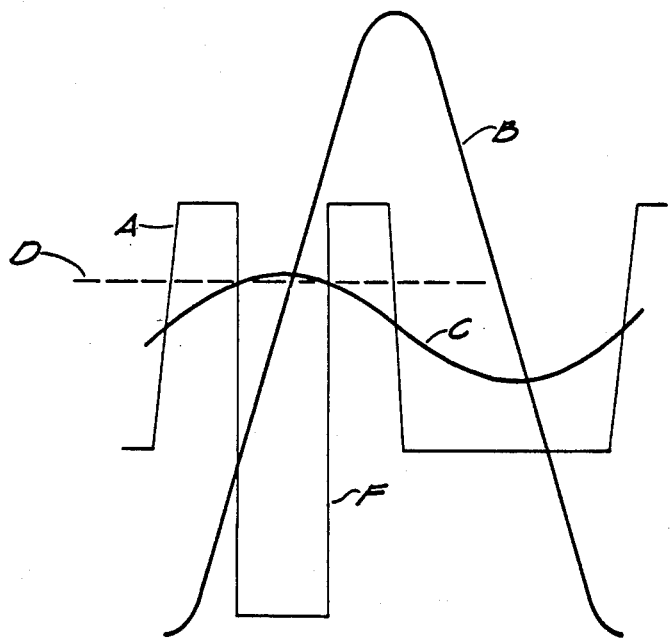

The turn on of the braking current by switching transistor 91 will be better understood by reference to FIGS. 2A, 2B, and 2C. In FIG. 2A the approximately square waveform A represents the drive current to coil 13 without motion amplitude regulation; this situation would prevail during startup of optical scanner oscillations before buildup of the desired motion amplitude. For comparison purposes the chopper amplitude waveform is shown at B in FIG. 2A. It will be noted that the amplitude waveform representing physical displacement of the chopper vanes is (lagging) 90 degrees out of phase with the drive current.

The convention used in 2A is that the upper level of waveform A represents drive current with transistor 23 off while the bottom level represents drive current with transistor 23 on.

Waveform C in FIG. 2A represents the output of pickup coil 33 which is essentially a linear function of velocity. Waveform C leads waveform B by 90 degrees and is thus in phase with waveform A. The waveform from pickup coil 13 could, of course, be reversed (shifted) 180 degrees by a reversal of the connections of terminals 35 and 37.

FIGS. 2B and 2C show the operation of the braking current switching controlling the optical scanner motion amplitude. It will be noted in FIG. 2B that the instantaneous amplitude of the pickup waveform C has very slightly exceeded the level D determined by the gain of amplifier 55 and the detection level of the instantaneous level detector circuit. Thus, for approximately 10 degrees before and after the peak of waveform C to instantaneous level detector circuit will cause transistor 91 to be turned on. This occurs during the period that drive transistor 23 is off. However, the turn on of transistor 91 causes a pulse of drive current indicated at E for a duration of about 20 degrees. The timing of pulse E makes it 180 degrees out of phase with the normal drive current thus producing a braking effect diminishing the motion amplitude of the optical chopper. The greater the width of pulse E the greater the braking effect. Thus, as shown in FIG. 2C, when the amplitude of the pickup waveform C is still more in excess of the level D, the braking pulse F which is correspondingly wider has a still greater braking effect.

It will be noted that the braking pulses E and F are of greater amplitude than the normal drive pulse of waveform A. This is due to the fact that resistor 97 has a value substantially less than resistor 21. For example, the relative values of resistors 21 and 97 may be determined so that the combination of the resistance of resistor 97 and the drive circuit resistance is about 50 percent of the combination of the resistance of 21 and the drive circuit resistance. This factor can be further reduced to about 20 percent beyond which there appears to be little effect. The effect of greater magnitude of braking pulses E and F is that much greater braking effect may be achieved from the same width (or narrower) braking pulse. The energy per unit time (or the power) provided by drive current or braking current is proportion to the square of the current amplitude. Therefore, if braking current is twice drive current its effect is four times as great over the same time period. Hence the braking time period can be shortened to produce a given braking power required to regulate the amplitude. If adequate braking is achieved by a narrow pulse the regulation is much more accurate and will be maintained within a few percent or less.

It is worthy of note that the operation of the instantaneous detection circuit is such that only a very small excess motion amplitude produces a relatively wide braking pulse and thus the range of regulation is small and the regulation accuracy good. For example, a motion amplitude excess of one percent will cause the pickup waveform to intercept the detection level at about eight degrees before and after the peak or center of the waveform. Thus, the braking current pulse may last almost 10 percent of one-half cycle of the driving current when there is only a one percent excess motion amplitude relative to the setting of the peak level detector. Ten percent pulse time will produce a much greater than 10 percent braking power due to the larger braking current and the square of current effect previously discussed. In practice, of course, the value for resistor 21 and other circuit parameters will be set so that there is always some excess drive current and always a braking pulse of greater or less width as required to bring the motion amplitude back to the desired level. Depending on the particular application the excess drive current produced in the absence of braking pulses produced by transistor 91 may be from about 10 percent to several hundred percent or more. In determining the excess drive current provided by the drive circuit and transistor 23 one requires consideration of the type of factors which may be expected to bring the regulator into operation. For example, a drop in power supply voltage due to partially discharged batteries as might occur in a satellite application would call for upside regulation of the motion amplitude. On the other hand, reduction of air pressure and reduction of wind drag on the optical chopper produces a tendency to increase motion amplitude and requires downside regulation. Downside regulation does not require an excess of drive current whereas upside regulation does require an initial excess of drive current.

The motion amplitude regulator circuit of the invention will be seen to be particularly adapted to control tuning forks, optical choppers, scanners and similar resonant apparatus wherein the "Q" of the mechanically resonant apparatus is relatively high, say over 100. Usually, the "Q" of such apparatus will be a thousand or more. The high "Q" means that the energy stored in the oscillating mechanical resonator is high compared to the energy which must be provided to maintain a steady oscillation. Therefore, the waveform of the cyclic pulses which drive the resonator is of little importance since a single pulse produces little change in the energy of the system and consequently little change in the motion amplitude or the velocity. At the same time it is very beneficial to detect small changes in the instantaneous velocity (which is proportional to amplitude) and apply immediate correction rather than to produce an average value requiring integration for some time before a suitable correction could be initiated.

It has been found for example that when the motion amplitude regulation circuit of the invention is applied to a mechanically resonant device such as an optical chopper extremely accurate motion amplitude regulation can be achieved. Such a chopper which experiences a 100 percent increase in amplitude upon evacuation of the chopper housing with the consequent decrease in air drag is found to be regulated to only a three percent increase in motion amplitude when the circuit of the invention is incorporated in the drive for the chopper. Similarly such a chopper which experiences plus or minus 20 percent motion amplitude variation with DC input voltage changes is limited to a motion amplitude variation of plus or minus two percent with the circuit of the invention.

Given the foregoing description and explanation it is beleived that design of circuits according to the invention for specific applications would be a straightforward exercise for one skilled in the art; as a further aid in understanding the invention the Table I below shows exemplary circuit element values and semi-conductor type numbers.

TABLE I

| ELEMENT REF. NO. | VALUE |
|---|---|
| RESISTANCE: | OHMS: |
| 13 | 200 |
| 21 | 1200 |
| 25 | 71.5 |
| 37 | 100. |
| 39 | 1000. |
| 57 | 20K |
| 59 | 470 |
| 61 | 2000 |
| 67 | 4220 |
| 69 | 10K |
| 75 | 47K |
| 79 | 2700 |
| 81 | 4300 |
| 85 | 2400 |
| 87 | 200 |
| 89 | 6200 |
| 93 | 4700 |
| 97 | 536 |
| CAPACITANCE: | MICROFARADS: |
| 41,43 | 56. |
| 45 | .01 |
| 53 | 6.8 |
| 63 | 47. |
| SEMICONDUCTORS: | TYPE NUMBERS: |
| 23 | 2N2219A |
| 71,83 | 2N2907A |
| 77,91 | 2N2222A |
| 65 | 1N4576A |

It will be understood by those skilled in the art that the present invention also may be applied to rotary electric motors. An electromagnetically driven tuning fork resonator is, of course, an electric motor also, but it produces vibratory motion rather than rotary motion. The conceived applicability of the instant motion amplitude regulation circuitry to rotary motors would be to DC motors rather than synchronous or other alternating current motors. For example a conventional DC motor with a split-ring commutator may be provided with a shaft mounted magnetic gear tooth arrangement together with a magnetic pickup coil to produce a velocity sensitive sine wave in response to motor shaft motion (this is in effect an AC tachometer). This sensor would be analagous to the tuning fork pickup coil. Excess velocity of the motor would cause the level comparator to trigger the motor's power supply to produce a negative or braking current which should be on the order of twice the motor forward drive current. In the case of a rotating motor it is possible to obtain large braking currents by means of a near short circuit of the motor armature windings due to the large reverse current produced by the motor back emf. This is the well known dynamic braking effect. The dynamic braking effect could be utilized under control of the instantaneous AC level comparator circuit eliminating any necessity for applying a reverse voltage.

Furthermore, the invention may be particularly applicable to electric motors employing electronic commutation. In such case an electromagnetic or other sensor of the shaft position and velocity for controlling commutation may also be employed to provide the AC (sine wave) voltage signal supplied to the instantaneous AC level comparator circuit.

From the foregoing explanation it will be seen that according to the present invention a circuit is provided which serves to regulate the motion amplitude of a resonant mechanical device in a particularly efficient and effective manner. It does not require any additional motion sensor or pickup other than the conventional pickup coil (although a separate sensor could be utilized if that was ever desirable). Also, the braking current which controls the motion amplitude is conducted through the conventional drive coil in the preferred embodiment without requiring addition to or alteration of the drive mechanism for the resonant mechanism. Again, should there be any reason for it a separate drive coil could be provided for the braking current. The amplifier circuits and switching circuits employed in the apparatus may in many cases be replaced by equivalent circuits. There is, however, a distinct advantage in the AC instantaneous level detector circuit which avoids the effect of DC level shift so that the AC signal representing the motion amplitude is accurately measured and compared with the internal zener diode reference.

In addition to the variations and modifications to the preferred embodiment of the apparatus shown or suggested herein other variations and modifications will be apparent to those skilled in the art and accordingly the scope of the invention is not to be deemed to be limited to those variations and modifications of the invention shown or suggested but is rather to be determined by reference to the appended claims.

What is claimed is:

1. A voltage comparison circuit comprising,
   an amplifier producing a fluctuating voltage DC signal,
   means for isolating the AC component of said signal,
   a semiconductor switch circuit having an input connected to receive said AC component of said signal,
   said switch circuit being adapted to operate from a fixed voltage DC power supply, means for establishing a DC level of said AC component including a voltage reference element with a reference voltage substantially less than the voltage of said power supply and a voltage dividing circuit in parallel therewith having its divided voltage point connected to said input of said semiconductor switch circuit, and means for connecting the undivided voltage of said voltage reference element to bias said semiconductor switch circuit, whereby the output of said semiconductor switch circuit provides an instantaneous AC voltage level-detecting, internally-referenced voltage comparison circuit.

2. Apparatus as recited in claim 1 wherein said voltage reference element comprises,
a zener diode.

3. Apparatus as recited in claim 1 wherein said switch circuit comprises,
a transistor with its base being the switch circuit input and said divided voltage point is connected to the base of said transistor by a conductive element.

4. Apparatus as recited in claim 1 wherein said switch circuit is powered from a source not voltage regulated from said voltage reference element.

5. Apparatus as recited in claim 1 wherein said amplifier is an adjustable gain amplifier.

6. A voltage comparison circuit to be operated from a DC power supply comprising,
an amplifier producing a fluctuating voltage DC signal,
means for selectively transmitting the AC component of said signal,
a semiconductor switch circuit having an input connected to receive only said AC component of said signal,
means for establishing a DC level of said AC component including at least one voltage reference element with a reference voltage substantially less than the voltage of said power supply and a voltage dividing circuit in parallel with one of said at least one voltage reference element having its divided voltage point connected to said input, and
means for connecting the voltage of one of said at least one voltage reference element to bias and semiconductor switch circuit.

7. Apparatus as recited in claim 6 wherein one of said voltage reference elements comprises,
a zener diode.

8. Apparatus as recited in claim 6 wherein said switch circuit comprises,
a transistor with its base being the switch circuit input and said divided voltage point is connected to the base of said transistor by a conductive element.

9. Apparatus as recited in claim 6 wherein said amplifier is an adjustable gain amplifier.

10. A voltage comparison circuit to be operated from a DC power supply comprising, an amplifier producing a fluctuating voltage DC signal,
means for selectively transmitting the AC component of said signal,
a semiconductor switch circuit with an input connected to receive said AC component without rectification,
means for establishing a non-zero DC level of said AC component including a voltage reference element with a reference voltage substantially less than the voltage of said power supply and a voltage dividing circuit comprising two resistors connected in series with each other and in parallel with said reference element,
the junction of said resistors being connected to establish the DC level at said input of said semiconductor switch circuit, and
means for connecting the voltage of a voltage reference to determine a detection level for said semiconductor switch circuit,
whereby the output of said semiconductor switch provides an instantaneous AC voltage level-detecting, internally-referenced voltage comparison circuit.

11. A voltage comparison circuit comprising,
an amplifier producing a fluctuating voltage DC signal,
means for selectively transmitting the AC component of said signal,
a semiconductor switch circuit with an input connected to receive said AC component without rectification,
a source of DC voltage to power said switch circuit,
means for establishing a non-zero DC level of said AC component including a voltage reference element with a reference voltage substantially less than the voltage of said source and a voltage dividing circuit in parallel therewith having its divided voltage point connected to establish the DC level of said input of said semiconductor switch circuit, and
means for connecting the voltage of a voltage reference to determine a detection level for said semiconductor switch circuit,
whereby the output of said semiconductor switch circuit provides an instantaneous AC voltage level-detecting,
internally-referenced voltage comparison circuit.

12. Apparatus as recited in claim 11 wherein said voltage reference element comprises,
a zener diode.

13. Apparatus as recited in claim 11 wherein said switch circuit comprises,
a transistor with its base being the switch circuit input and said divided voltage point is connected to the base of said transistor by a conductive element.

14. Apparatus as recited in claim 11 wherein said amplifier is an adjustable gain amplifier.

* * * * *